(12) United States Patent
Ohkubo

(10) Patent No.: US 6,701,497 B1
(45) Date of Patent: Mar. 2, 2004

(54) METHOD FOR EFFECTIVE CAPACITANCE CALCULATION OF INTERCONNECT PORTION AND DELAY CALCULATION OF ELECTRONIC CIRCUIT

(75) Inventor: Norio Ohkubo, Tokyo (JP)

(73) Assignee: Hitachi, Ltd., Tokyo (JP)

( * ) Notice: Subject to any disclaimer, the term of this patent is extended or adjusted under 35 U.S.C. 154(b) by 234 days.

(21) Appl. No.: 09/678,660

(22) Filed: Oct. 4, 2000

(30) Foreign Application Priority Data

Oct. 4, 1999 (JP) .......................................... 11-283119

(51) Int. Cl.$^7$ ................................................ G06F 9/45
(52) U.S. Cl. ................................................ 716/6; 703/4
(58) Field of Search ........................ 716/1, 2, 6; 703/2, 703/4, 19

(56) References Cited

U.S. PATENT DOCUMENTS

| | | | | |
|---|---|---|---|---|
| 5,469,366 A | * | 11/1995 | Yang et al. ..................... | 716/6 |
| 5,761,076 A | * | 6/1998 | Miki .............................. | 716/5 |
| 5,787,008 A | * | 7/1998 | Pullela et al. ................. | 703/19 |
| 5,790,415 A | * | 8/1998 | Pullela et al. ................. | 716/6 |
| 6,314,546 B1 | * | 11/2001 | Muddu ........................... | 716/5 |
| 6,347,393 B1 | * | 2/2002 | Alpert et al. ................... | 716/2 |
| 6,353,917 B1 | * | 3/2002 | Muddu et al. ................. | 716/6 |
| 6,496,960 B1 | * | 12/2002 | Kashyap et al. ................ | 716/4 |
| 6,510,404 B1 | * | 1/2003 | Kuriyama et al. ............. | 703/6 |

* cited by examiner

*Primary Examiner*—Stacy Whitmore
(74) *Attorney, Agent, or Firm*—Antonelli, Terry, Stout & Kraus, LLP

(57) ABSTRACT

The present invention provides a high-speed processing and high precision delay calculation method of semiconductor integrated circuit devices having a plurality of cells and interconnections connecting therebetween, with less data to be obtained prior to delay calculation. The method comprises the steps of: calculating temporary delay T0 that is the delay of the cell on the basis of total load capacitance Ct of the capacitance values connected to the output of the cell; calculating the voltage Vc at the node connected to the load capacitance C connected to the output of the cell at the temporary delay T0; calculating effective load capacitance Ceff by multiplying the ratio of the voltage Vc to the voltage Vtb defining the delay with the capacitance C; calculating the cell delay Tc on the basis of the effective load capacitance Ceff.

6 Claims, 8 Drawing Sheets

312 cell library

| cell type | | delay parameter | | | | transition parameter | | | |
|---|---|---|---|---|---|---|---|---|---|
| | | 701 | | | | 702 | | | |
| | | a1 | b1 | c1 | d1 | a2 | b2 | c2 | d2 |
| INV | rising | | | | | | | | |
| | falling | | | | | | | | |
| NAND2 | rising | | | | | | | | |
| | falling | | | | | | | | |
| . | . | . | . | . | . | . | . | . | . |
| . | . | . | . | . | . | . | . | . | . |
| . | . | . | . | . | . | . | . | . | . |

(703 labels the transition parameter column group)

312 cell library

| cell type | | delay parameter | | | | transition parameter | | | |
|---|---|---|---|---|---|---|---|---|---|
| | | a1 | b1 | c1 | d1 | a2 | b2 | c2 | d2 |
| INV | rising | | | | | | | | |
| | falling | | | | | | | | |
| NAND2 | rising | | | | | | | | |
| | falling | | | | | | | | |
| ⋮ | ⋮ | ⋮ | ⋮ | ⋮ | ⋮ | ⋮ | ⋮ | ⋮ | ⋮ |

701, 702, 703

METHOD FOR EFFECTIVE CAPACITANCE CALCULATION OF INTERCONNECT PORTION AND DELAY CALCULATION OF ELECTRONIC CIRCUIT

FIELD OF THE INVENTION

The present invention relates to a method for calculating an effective capacitance in an electronic circuit unit coupling a plurality of electronic circuit elements with interconnect portions, particularly in a semiconductor integrated circuit device coupling a plurality of cells with interconnect portions, a method for calculating delay using the same, and a method for constructing a cell library therefor. More particularly to an effective method for calculating delay suitable for designing an electronic circuit unit or an integrated circuit device using a computer and/or verifying the design file therefor.

BACKGROUND OF THE INVENTION

In recent design of increasingly complex semiconductor integrated circuit devices, calculation of delay is very important and a high-speed and high precision delay calculation method is required for designing a high performance semiconductor integrated circuit device. The calculation of delay is also important for the verification of design files, thus a higher calculation accuracy is required for assuring the operation of semiconductor integrated circuit devices to be produced.

In the semiconductor integrated circuit devices which are growing increasingly, the dynamic calculation method of delay such as a circuit simulation may take too much times for processing and may be difficult to use in practice. As methods for calculating delay quickly to the date, some static delay calculation methods have been used by calculating cell delay based on the cell load capacitance and input transition to calculate interconnect delay from the interconnect resistance and interconnect capacitance.

However, the processing technology of the semiconductor integrated circuits tends to become more finer than ever so that the increase of cell driving power together with the increase of interconnect resistance may enhance the shielding effect that may result in the apparently smaller load capacitance in the output of cell than the actually total load capacitance. Some simple delay calculation method may result in unacceptable errors.

A high-precision delay calculation method that can take into account the shielding effect is the calculation method using the effective length of interconnection, disclosed in the Japanese Unexamined Patent Publication No. H9-298242. By using the interconnect effective length, the load delay calculation of semiconductor integrated circuits using interconnections having some resistance may be allowed to perform at higher precision and higher speed.

In the delay calculation method using the interconnect effective length in the prior art, there is a problem that since the interconnect effective length may differ according to the combination of cell driving power and the interconnection type, a huge quantity of data must be gathered prior to delay calculation, as well as many process steps are required at the time when changing cells or changing devices, and changing the interconnection parameter, so that the designing period of semiconductor integrated circuit device is prolonged because of such a number of process steps.

In particular, for the design of a high performance semiconductor integrated circuit device, cell design is performed in parallel along with the logic design to attempt to increase the performance, however in such process the increase of the number of process steps for obtaining data may become a serious problem.

More specifically, for a very high speed LSI, which may require high-speed operation of 500 MHz or over, the influence brought by the parasitic interconnect resistance may be considered to be considerably, a designing and producing methodology of integrated circuit devices using a calculation method of signal delay of higher precision and higher efficiency is needed.

An object of the invention is to provide an improved method for effective capacitance calculation of interconnection portion and delay calculation of electronic circuits.

SUMMARY OF THE INVENTION

The present invention has been made in view of the above circumstances and has an object to overcome the above problems and to provide, by substituting the impedance of interconnection portion placed between a first node of the output section of first electronic circuit element and a second node of the input section of second electronic circuit element with an equivalent circuit of RC π type having an equivalent capacitance C1 placed on the side of the second node, an equivalent capacitance C2 placed on the side of the first node and an equivalent resistance R placed between these both equivalent capacitors, and defining delay from the first electronic circuit element to the first node as t0, a method of calculation at higher precision of effective load capacitance Ceff viewed from the first node as $C2+C1 \cdot t0/(t0+R \cdot C1)$, as well as a method of calculation of the delay T of the electronic circuit, based on thus calculated effective load capacitance Ceff, by using the input transition time TI of the electronic circuit element previously determined by simulation and delay parameters a, b, c, and d, according to an equation $T = a \cdot TI \cdot Ceff + b \cdot Ceff + c \cdot TI + d$.

In accordance with an aspect of the present invention, a method of calculation of signal delay in a semiconductor integrated circuit device, the method of calculation of cell delay having the processes of:

(a-1) calculating temporary load delay T1 that is the load delay of the cell from the capacitance Ct that is the sum of all of values of capacitances connected to the output of the cell;

(a-2) calculating temporary RC delay T2 that is the delay in the load itself from the resistance and capacitance of the load connected to the output of the cell;

(a-3) calculating effective load capacitance Ceff from the temporary load delay T1 and the temporary RC delay T2;

(a-4) calculating cell delay Tc based on the effective load capacitance Ceff.

In accordance with another aspect of the present invention, a method of calculating signal delay in a semiconductor integrated circuit device, the calculation method of delay in interconnection connected to a cell having the processes of:

(b-1) calculating output transition time TT1 of the cell from the capacitance Ct that is the sum of all of value of capacitances connected to the output of the cell;

(b-2) calculating output transition time TT2 of the cell from the effective load capacitance Ceff;

(b-3) calculating temporary interconnection delay Tw0 from the input capacitance Cci of the load cell Celli connected to the interconnection resistance Rw and the interconnection capacitance Cw in the interconnections connected to the cell and;

(b-4) calculating interconnection delay Tw from the output transition time TT1 and the output transition time TT2 and the temporary interconnection delay Tw0.

Additional objects and advantages of the invention will be set forth in part in the description which follows and in part will be obvious from the description, or may be learned by practice of the invention. The objects and advantages of the invention may be realized and attained by means of the instrumentality and combination particularly pointed out in the appended claims.

DETAILED DESCRIPTION OF THE PREFERRED EMBODIMENTS

A detailed description of one preferred embodiments embodying the present invention will now be given by referring to the accompanying drawings.

Figure 1:
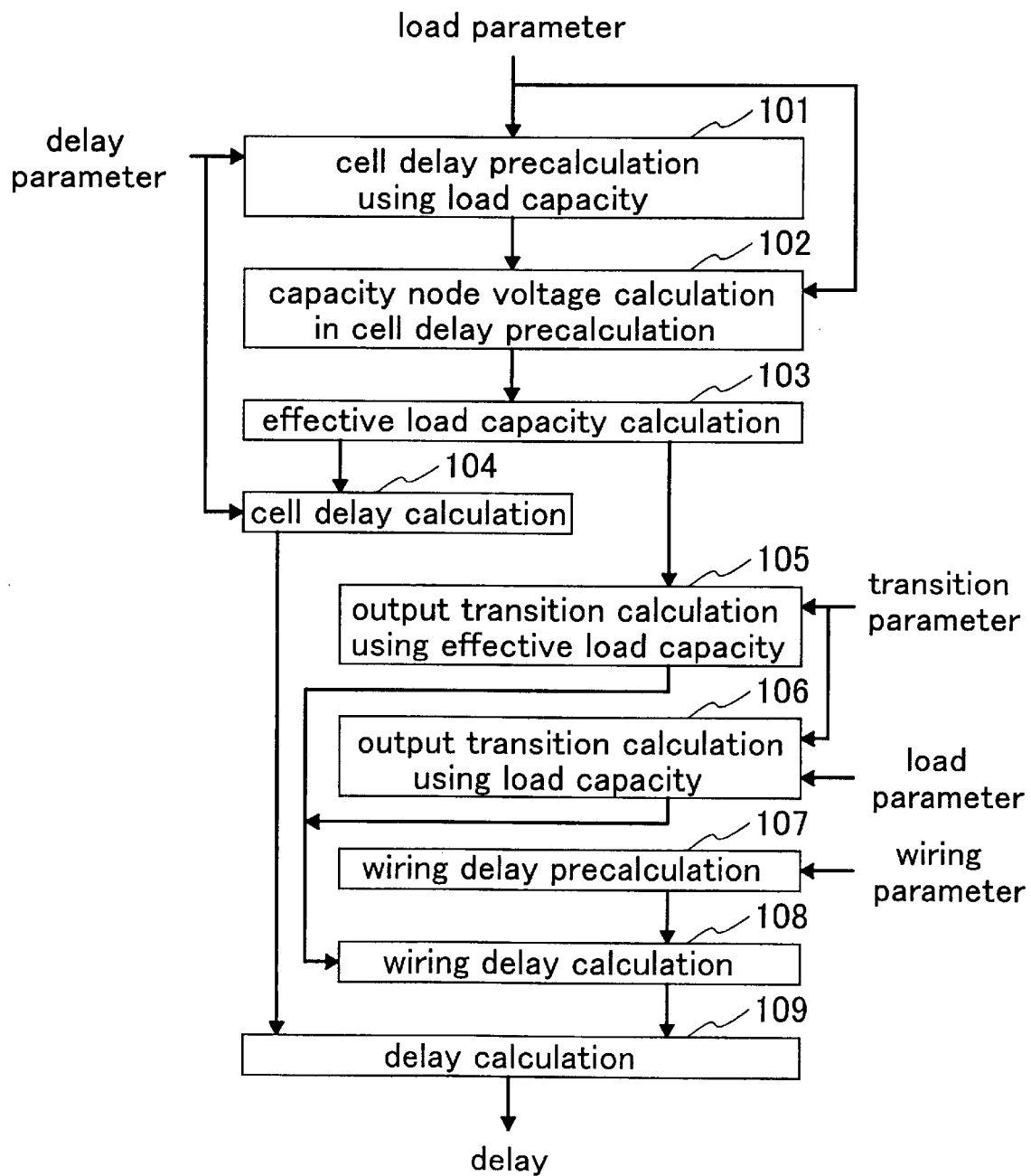
FIG. 1 is process procedures of the delay calculation method in accordance with one preferred embodiment of the present invention.

FIG. 1 shows an overview of the process steps of the delay calculation method in accordance with the preferred embodiment of the present invention. This method is a delay calculation method in a semiconductor integrated circuit device having a plurality of semiconductor cells usually well known as electronic circuit elements and of interconnections (wirings) connecting those elements, in accordance with the present process steps, effective load capacitance Ceff is determined by the temporary delay calculation process 101 (cell delay precalculation using load capacity) with the total load capacitance including the parasitic capacitance, the voltage calculation process 102 (capacity node voltage calculation in cell delay precalculation) of the capacitance node at the temporary cell delay time, and the effective load capacitance calculation process 103; the cell delay is determined by the cell delay calculation process 104 on the basis of the effective load capacitance Ceff; the interconnection delay is determined by the transition time calculation process 105 (output transition calculation using effective load capacity) with the effective capacitance, the transition time calculation process 106 (output transition calculation using load capacity) with the total capacitance, the temporary interconnect delay calculation process 107 (wiring delay precalculation), and the interconnect delay calculation process 108 (wiring delay calculation); and then finally delay is obtained by the delay calculation process 109.

The present process steps are characterized by the following points.

(1) By determining the temporary cell delay based on the total load capacitance, the effective load capacitance Ceff is calculated from the voltage of the capacitance nodes at the temporary delay time.

(2) The interconnection delay is determined from the transition time calculation 105 with the effective capacitance and from the transition time calculation 106 with the total capacitance.

Next, each process will be described in greater details.

The process 101 is the calculation of temporary cell delay on the basis of the total load capacitance, to calculate the temporary cell delay T0 that is the delay of the cell from the capacitance Ct that is the sum of all of values of capacitances connected to the output of the cell and the delay parameters.

The process 102 is the calculation of voltage of the capacitance nodes in the temporary delay, to calculate the voltage Vc at the temporary cell delay at the node connected to the load capacitance C connected to the output of the cell.

The process 103 is the calculation of effective load capacitance, to calculate the effective load capacitance Ceff by multiplying the capacitance C with the ratio of the voltage Vc to the voltage Vth defining the delay, namely C·Vc/Vth.

The process 104 is the calculation of cell delay, to calculate cell delay Tc that is the delay of the cell from the effective load capacitance Ceff.

The process 105 is the calculation of output transition time on the basis of the effective load capacitance, to calculate the output transition time TT1 that is the delay of the cell from the effective load capacitance Ceff and the transition time parameters.

The process 106 is the calculation of output transition time on the basis of the total load capacitance, to calculate the output transition time TT2 that is the transition time of the cell from the total load capacitance Ct and the transition parameters.

The process 107 is the calculation of the temporary interconnection delay, to calculate the temporary interconnection delay Tw0 from the interconnection parameters.

The process 108 is the calculation of interconnection delay, to calculate the interconnection delay Tw from the output transition times TT1 and TT2 and the temporary interconnection delay Tw0.

The process 109 is the calculation of delay, to calculate the delay by summing the cell delay Tc and the interconnection delay Tw.

In accordance with the present process procedure, the calculation needs only to obtain the load parameter and interconnection parameter from the design file, and to obtain the delay parameters intrinsic to the appropriate or predetermined cell and the transition parameters from the cell library, requiring no other parameters such as effective length of interconnections.

Accordingly the data to be obtained prior to the calculation process of delay is primarily the delay parameters and transition parameters for each cell, allowing a significant retrenchment of the process steps prior to processing.

In addition, in accordance with the present process procedure, the effective load capacitance is calculated at higher precision by considering the shielding effect that may result apparently in the load capacitance at the output point of a cell smaller than the total load capacitance.

Furthermore, since the interconnection delay is calculated from the output transition time of the cell on the basis of the effective load capacitance and the output transition time of the cell on the basis of the total load capacitance, the precision of the calculation of interconnection delay is improved.

In accordance with the present invention, because the delay of electronic devices is readily calculated at higher precision, a desirable electronic circuit device is allowed to be designed and produced.

Figure 2:
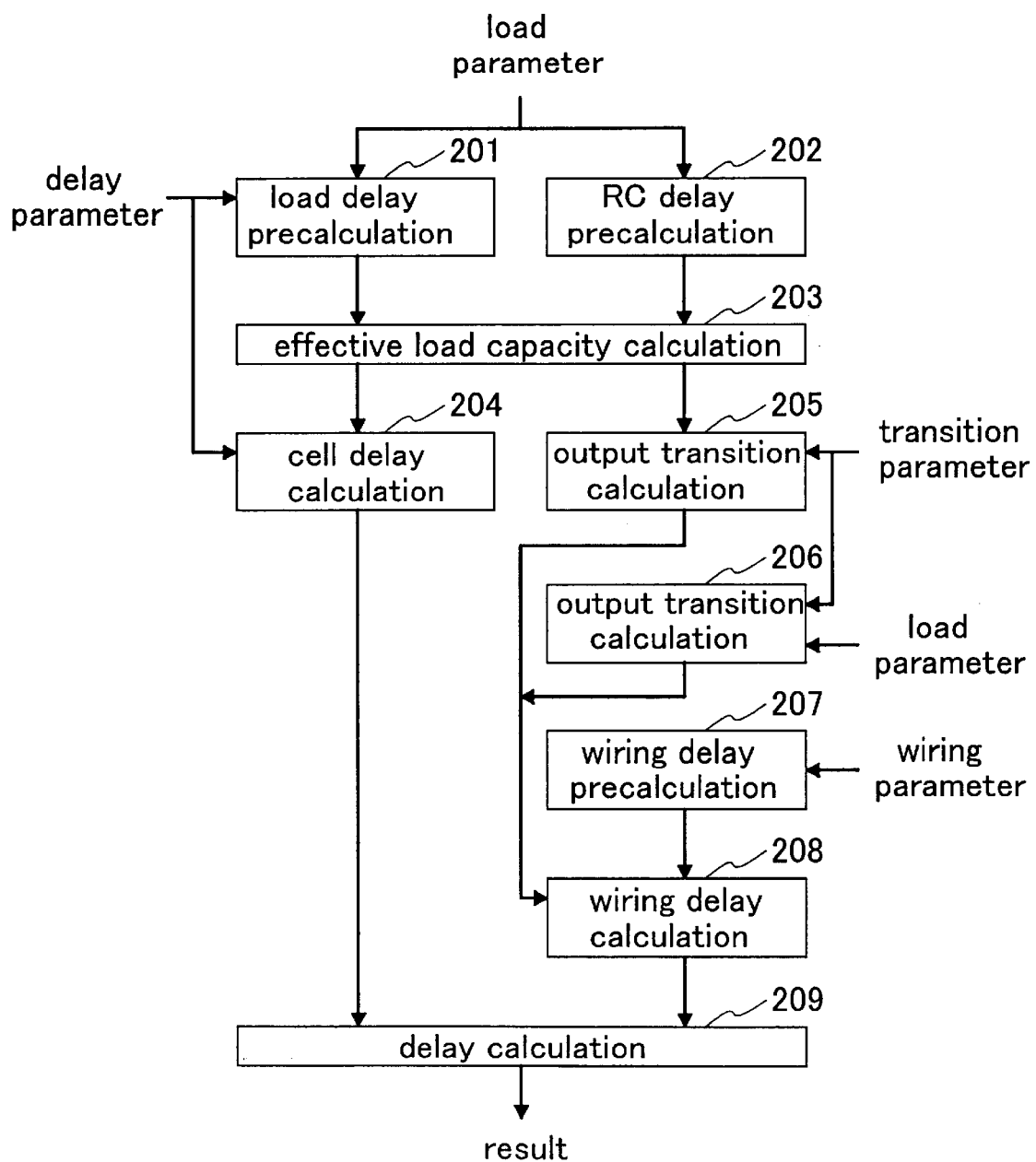
FIG. 2 is process procedures of the delay calculation method in accordance with another preferred embodiment of the present invention.

FIG. 2 shows another detailed process procedure of the method of delay calculation in accordance with the present invention.

A method of calculation of signal delay in an integrated circuit device having a plurality of semiconductor cells and interconnections (wirings) connecting those elements, in accordance with the present process procedure, the effective load capacitance Ceff is determined by processing the temporary calculation of load delay in the process step 201 (load delay precalculation), the temporary calculation of RC delay in the process step 202 (RC delay precalculation), and the calculation of effective load capacitance in the process step 203 (effective load capacity calculation), the cell delay is determined by processing the cell delay calculation in the process step 204 from the effective load capacitance Ceff, then the interconnection delay is determined by processing the output transition time calculation in the process steps 205 and 206 (output transition calculation), the temporary interconnection delay calculation in the process step 207 (wiring delay precalculation), and the interconnection delay calculation in the process step 208 (wiring delay calculation), and the finally the delay is obtained by the delay calculation in the process step 209. The present process procedure is characterized by the following points.

(1) Effective load capacitance Ceff is determined from the temporary load delay on the basis of total load capacitance and the temporary RC delay by the load.

(2) Interconnection delay is calculated from the output transition time calculation on the basis of the effective load capacitance and the output transition time calculation on the basis of the total load capacitance.

Next, the process of precise calculation of the signal delay from the input of first stage cell to the input of the last stage cell in case of connecting the output of the first stage cell to the input of the last stage cell with interconnection will be described in greater details below. It should be noted that in an actual integrated circuit device in which a number of cells is connected in a cascade manner, the delay may be obtained by stacking and accumulating the method of delay calculation targeting two cells as described below for a number of times.

The process step 201 is the calculation of temporary load delay, to calculate temporary load delay T1 that is the load delay of the cell from the total load capacitance Ct that is the sum of all load capacitance values including the circuit element capacitance and distribution interconnection capacitance within the impedance connected to the output of the appropriate (predetermined) first stage cell. This process calculates for example in accordance with the following equation on the basis of the coefficient of delay variation Ron and the total load capacitance Ct with respect to the load capacitance of the appropriate cell. Here Ron is the delay variation coefficient with respect to the load capacitance of the appropriate cell, which corresponds to the gradient (inclination) of the primary part of the characteristics curve when plotting the load capacitance in abscissa and the circuit load delay of the cell in ordinate, as shown in FIG. 1 of the Japanese Unexamined Patent Publication No. H9-298242 as described above.

$$T1 = Ron \cdot Ct \qquad [\text{eq. 1}]$$

The process 202 is temporary RC delay calculation, to calculate the temporary RC delay T2 that is the delay in the load on the basis of the resistance and the capacitance of the load connected to the output of the cell. This process substitutes for example the load including impedance connected to the output of the cell, in particular the distribution interconnection resistance and the distribution interconnection capacitance with an equivalent circuit of RC $\pi$ of one stage, having a capacitance C2 connected to the output of the cell, a resistance R, and a capacitance C1 connected to the other node of the resistance R to calculate on the basis of the resistance R and the capacitance C1 in accordance with the following equation:

$$T2 = R \cdot C1 \qquad [\text{eq. 2}]$$

The process 203 is the calculation of effective load capacitance, to calculate the effective load capacitance Ceff from the temporary load delay T1 and the temporary RC delay T2. This process calculates for example in accordance with the following equation on the basis of the capacitance C1 of the equivalent circuit of $\pi$ type and the capacitance C2 and the temporary load delay T1 and the temporary RC delay T2:

$$Ceff = C2 + C1 \cdot T1/(T1+T2) \qquad [\text{eq. 3}]$$

The process 204 is the calculation of cell delay Tc, namely the delay from the input to the output of the appropriate cell, to calculate on the basis of the effective load capacitance Ceff.

Figures 7, 8:
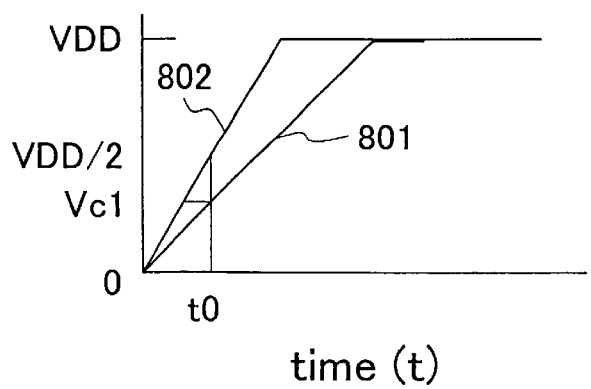
FIG. 7 is a schematic diagram of a cell library in accordance with one preferred embodiment of the present invention.
FIG. 8 is a schematic diagram illustrating the cell delay calculation method in accordance with the present invention.

This process calculates in accordance with the following equation on the basis of the effective load capacitance Ceff and the input transition time TI of the cell (i.e., the time required for the input waveform of a cell to transit from the beginning of the input to a predetermined value) and the delay parameters a1, b1, c1, d1. It is to be noted that values of a1, b1, c1, d1 here are intrinsic for each cell, and can be predetermined by iteratively repeating the circuit simulation for each kind (type) of cells on the basis of the following equation. In practice, it is more desirable to determine appropriate parameters in correspondence with the rising and falling of output signal pulses for each kind (type) of cells as shown in FIG. 7.

$$Tc = a1 \cdot TI \cdot Ceff + b1 \ Ceff + c1 \cdot TI + d1 \qquad [\text{eq. 4}]$$

Followings are with respect to the calculation of signal delay in the interconnections, the process 205 is the calculation of output transition time of the appropriate cell in accordance with the effective load capacitance Ceff, to calculate the output transition time TT1 on the basis of the effective load capacitance Ceff. This process calculates for example in accordance with the following equation from the effective load capacitance Ceff and the input transition time TI of the cell and the transition time parameters a2, b2, c2, d2. It is to be noted that these transition parameters intrinsic to each cell can also be predetermined, as shown in FIG. 7, on the basis of the following equation, by the actual circuit simulation for each kind (type) of cells, same as the foregoing delay parameters.

$$TT1 = a2 \cdot TI \cdot Ceff + b2 \cdot Ceff + c2 \cdot TI + d2 \qquad [\text{eq. 5}]$$

The process 206 is the calculation of output transition time of the appropriate (predetermined) cell from the total load capacitance Ct, to calculate the output transition time TT2 on the basis of the total load capacitance Ct. This process calculates for example in accordance with the following equation on the basis of the total load capacitance Ct and the input transition time TI of the cell and the transition parameters a2, b2, c2, d2.

$$TT2 = a2 \cdot TI \cdot Ct + b2 \cdot Ct + c2 \cdot TI + d2 \qquad [\text{eq. 6}]$$

The process 207 is the calculation of the temporary interconnection delay, to calculate the temporary interconnection delay Tw0 on the basis of the interconnection parameters. This process step has for example, process step (b-3-1) to calculate partial interconnection delay Tw1 from the interconnection resistance R1 from the starting point to the first divergence point (branch point) 1 for determining the interconnection delay and the branch capacitance C1 that is the total capacitance downward from the branch point 1, in accordance with the equation Tw1=R1·C1, then process step (b-3-2) to calculate the partial interconnection delay Tw2 on the basis of the interconnection resistance R2 from the branch point 1 to the next branch point 2 and the branch capacitance C2 that is total capacitance downward from the branch point 2, in accordance with the equation Tw2=R2·C2, and then process step (b-3-3) to repeat such calculation until the end point to determine the interconnection delay to sum all partial interconnection delays Twi to calculate the temporary interconnection delay Tw0.

The process 208 is the calculation of interconnection delay Tw in the interconnection from the output of the first stage cell to the input of the last stage cell, to calculate on the basis of the output transition time TT1 and TT2 and the temporary interconnection delay Tw0.

$$Tw = Tw0 + \{\alpha(TT1-TT2)-Tw0\} \cdot Tw0/(\beta \cdot TT2 + \gamma \cdot Tw0) \qquad [\text{eq. 7}]$$

,where $\alpha$, $\beta$, $\gamma$ are constants determined by the circuit simulation to the interconnection portions on the basis of eq. 7 above, and may be used for example such values as $\alpha=4$, $\beta=1$, $\gamma 2$.

The process 209 is the calculation of total delay from the input of the first stage cell to the input of the last stage cell, to calculate the total delay by adding the cell delay Tc and the interconnection delay Tw.

In addition, in accordance with the present process procedure, the calculation needs only to obtain the load parameter and the interconnection parameter from the design file and to obtain the delay parameters and the transition parameters of the appropriate (predetermined) cell from the cell library, requiring no other parameters such as effective interconnection length. Therefore, the data to be obtained prior to the calculation process of delay is solely the delay parameters and transition parameters for each cell, allowing a significant retrenchment of the process steps prior to processing.

In addition, in accordance with the present process procedure, because the shield effect that indicates apparently the load capacitance at the output point of a cell smaller than the total load capacitance is considered as the effective load capacitance at higher precision, more accurate calculation is allowed.

Furthermore, since the interconnection delay is calculated from the output transition time of the cell, the precision of the calculation of delay is improved.

Figure 4:
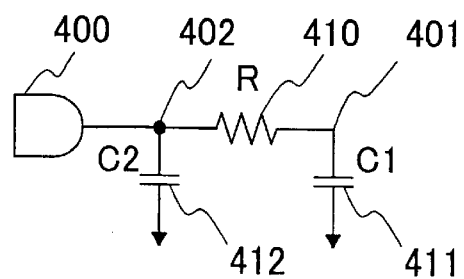
FIG. 4 is a circuit diagram depicting the cell delay calculation method in accordance with the present invention.

Next, the effective load capacitance Ceff will be described in greater details below. FIG. 4 shows a circuit diagram on the output load of a cell substituted with an equivalent circuit of one stage RC $\pi$ type. In the drawing, the reference numeral 400 designates to a cell, 401 and 402 to nodes, 410 to an equivalent resistance element, 411 and 412 are equivalent capacitance elements. Also, the resistance of the equivalent resistance element 410 is referred to as R, the capacitance of the equivalent capacitance elements 411 and 412 as C1 and C2, respectively.

Figure 10:
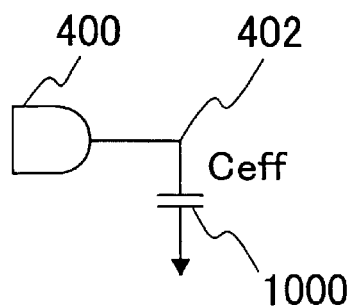
FIG. 10 is another circuit diagram illustrating the cell delay calculation method in accordance with the present invention.

FIG. 10 shows the output load of FIG. 4 as one effective load capacitance Ceff. Here 1000 is the effective load capacitance Ceff used for calculate the delay of the cell 400.

FIG. 8 shows conceptually the voltage at nodes 401 and 402 of FIG. 4. In the figure Vdd designates to the supply voltage of cell 400, line 801 to the voltage at the node 401, line 802 to the voltage at node 402. At the output node 402 of the cell 400, the effective load capacitance Ceff appearing at the delayed time is smaller than the total load capacitance Ct=C1+C2.

The present inventor has found that the reason is that the equivalent capacitance of the capacitance element 411 at the output node 402 becomes smaller than C1 at the time Vdd/2, which defines the delay of the cell 400, because the voltage at the node 401 does not reach to Vdd/2 under the influence of resistance element 410 at the time when the voltage at the output node 402 reaches to Vdd/2.

Also, the present inventor has found that the equivalent capacitance thereof is the value multiplying C1 with the ratio of the voltage Vc of the node 401 at the time when the node 402 reaches to Vdd/2 to the Vdd/2 that defines the delay.

The inventor has also found that as the result of a number of circuit simulation performed, the effective load capacitance Ceff in FIG. 4 may be calculated in accordance with the following equation:

$$Ceff = C2 + C1 \cdot \{Ron \cdot (C1+C2)\}/\{Ron \cdot (C1+C2) + R \cdot C1\} \qquad [\text{eq. 8}]$$

This equation will become Ceff=C2+C1 when R=0, and Ceff=C2 when R=infinite, which reflects well the actual phenomenon. Also this equation indicates C1 multiplied with the voltage ratio at the node 401 and at the node 402 when the output wave in FIG. 8 is linear proximate, that the delay t0 to the node 402 is Ron·(C1+C2), and that the delay from the node 402 to the node 401 is defined as R·C1.

The calculation of Ceff using the above eq. 8 may be performed for example in a computer program by the process including three additions, three multiplications and one division, enabling high-speed processing. In addition, such operating program allows the designer of semiconductor integrated circuit devices to effectively apply the program to the computer routinely used, by storing on a recording medium such as CDROM and magnetic disc.

In addition, as another calculation of effective load capacitance Ceff, it is possible to calculate it in accordance with the following equation when determining the delay t0 to the node 402 from the output transition time and the like:

$$Ceff = C2 + C1 \cdot t0/(t0 + R \cdot C1) \qquad [\text{eq. 9}]$$

Next the interconnection delay Tw will be described in greater details below.

Figure 5:
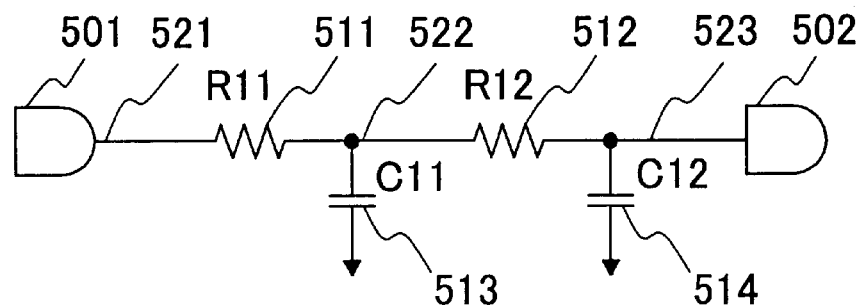
FIG. 5 is a circuit diagram depicting the interconnection delay calculation method in accordance with the present invention.

FIG. 5 shows a circuit diagram illustrating the method of interconnection delay calculation. In the figure, reference numerals 501 and 502 designate to cells, 521, 522, 523 to nodes, 511, 512 to equivalent resistant elements, 513, 514 to equivalent capacitance elements. In addition the resistance of the resistant element 511 and 512 are R11 and R12, the capacitance of capacitive elements 513 and 514 are C11 and C12, respectively. In the figure, the interconnection delay from the node 521 to the node 523 is determined. At first, in accordance with the process (b-3-1) to (b-3-3), the temporary interconnection delay Tw0 will be calculated by the following equation.

$$Tw0 = R11 \cdot (C12 + C11) + R12 \cdot C12 \qquad [\text{eq. 10}]$$

Next, compensation by the voltage waveform of the output node 521 of the cell 501 is performed.

The inventor has found that this voltage waveform has two regions of transition time t1 by the effective load capacitance and of transition time t2 by the total capacitance, and also found that the interconnection delay may be effectively derived from these transition times. This will be described below in greater details with reference to the drawings.

Figure 9:
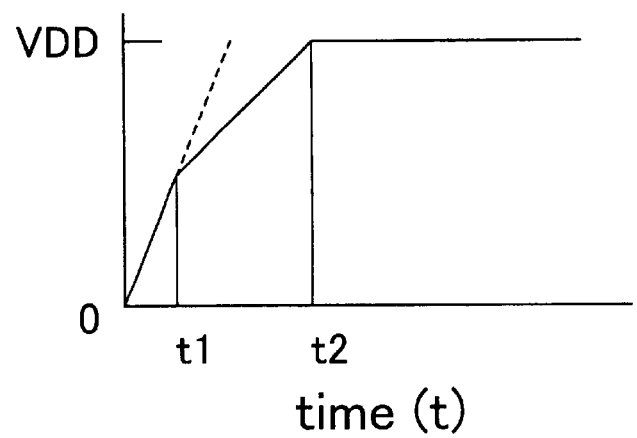
FIG. 9 is a schematic diagram illustrating the interconnection delay calculation method in accordance with the present invention.

FIG. 9 shows conceptually the voltage at the node 521 in FIG. 5. Here Vdd designates to the supply voltage of the cell. In the figure transition is dependent on the effective load capacitance Ceff until the moment t1, while the transition is dependent on the total load capacitance Ct in the period from the moment t1 to the moment t2.

This is a phenomenon significantly appeared when the interconnection resistance is larger with respect to the coefficient of delay variation Ron for the load capacitance.

The interconnection delay caused by such waveforms has been found to be compensated for by the equation according to eq. 7.

The calculation of interconnection delay Tw using eq. 7 is performed for example in a computer program by the process including four additions and subtractions, four multiplications and one division, enabling high-speed processing. In addition, such operating program allows to effectively apply to the designing and production of LSI when storing such program on a recording medium, as have been described above.

Figure 6:
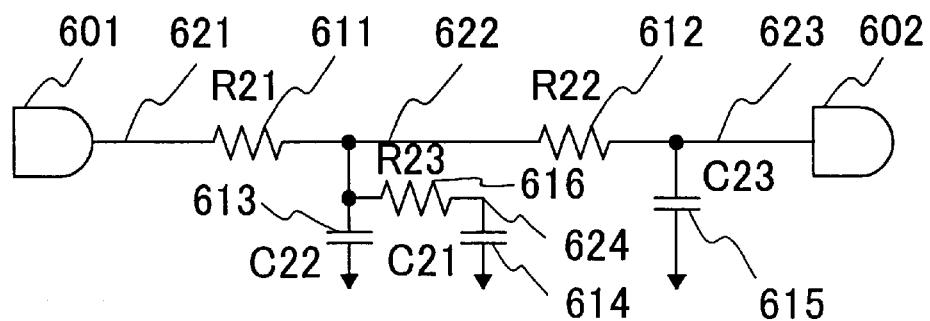
FIG. 6 is another circuit diagram depicting the interconnection delay calculation method in accordance with the present invention.

FIG. 6 shows another circuit diagram illustrating the method of interconnection delay calculation, with the load of branch line shown by one step equivalent circuit of RC π type.

Here the reference numerals 601 and 602 designate to cells, reference numerals 621, 622, 623, 624 to nodes, 611, 612, 616 to equivalent resistive elements, 613, 614, 615 to equivalent capacitive elements. The resistance of resistive elements 611, 612, 616 will be R21, R22, R23, andthe capacitance of capacitive elements 613, 614, 615, C22, C21, C23, respectively.

In the figure, the interconnection delay from the node 621 to the node 623 is determined.

At first the reference interconnection delay Tb will be calculated in accordance with the following equation.

$$Tb = R21 \cdot (C23 + C22 + C21) + R22 \cdot C23 \qquad [\text{eq. 11}]$$

Next, the effective capacitance C622 of the node 622 is determined in accordance with the following equation, in a manner similar to that of the effective load capacitance of the cells with respect to the load of branch line at the node 622:

$$C622 = C23 + C22 + C21 \cdot Tb/(Tb + R23 \cdot C21) \qquad [\text{eq. 12}]$$

The interconnection delay Tw is calculated by using this effective capacitance C622 in accordance with the following equation:

$$\text{Interconnection delay } Tw = R21 \cdot (C23 + C622) + R22 \cdot C23 \qquad [\text{eq. 13}]$$

Then, the compensation by the voltage waveform of the output node 621 of the cell 601 is performed, for example, this may be calculated in a manner similar to the process described above with reference to FIG. 5.

In the present process, the branch line load is treated as the effective capacitance, the interconnection delay is calculated at higher precision.

The delay calculation method in accordance with the present invention is implemented as a program running on a computer.

Figure 3:
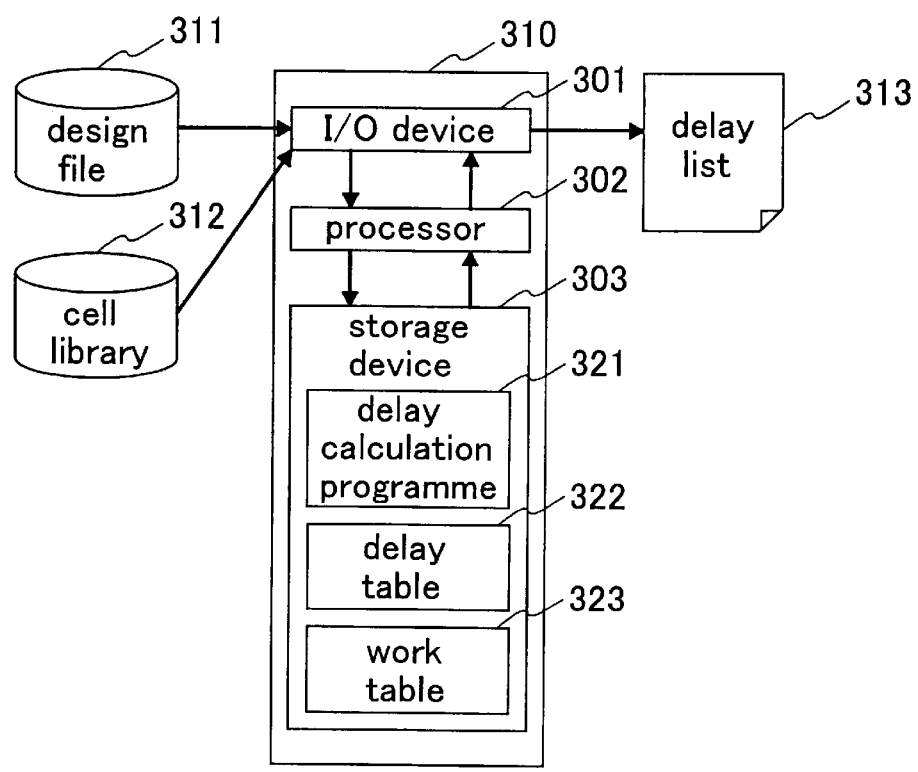
FIG. 3 is an overview of a system in accordance with one referred embodiment of the present invention.

FIG. 3 is an overview of a system in accordance with the preferred embodiment of the present invention.

In the figure the reference numeral 310 designates to a processing apparatus, 311 to a design file indicating the connectivity of cells, 312 to a cell library, 313 to a delay list, 301 to an I/O device, 302 to an execution unit (or a processor), 303 to a memory unit (or a storage device). The reference numeral 321 is a delay calculation program in the memory unit (storage device) 303, which is expectable for effective operation in accordance with the classification of various products to be designed if stored on a separate recording medium as have been described above. The reference numeral 322 is a delay table, 323 is a working table.

The delay calculation method in accordance with the present invention is stored as a program in the delay calculation program region 321, for reading the design file 311, the cell library 312 via the I/O device 301, performing the operation by the processor 302, and outputting the delay list 313 via the I/O device 301.

Figure 11:
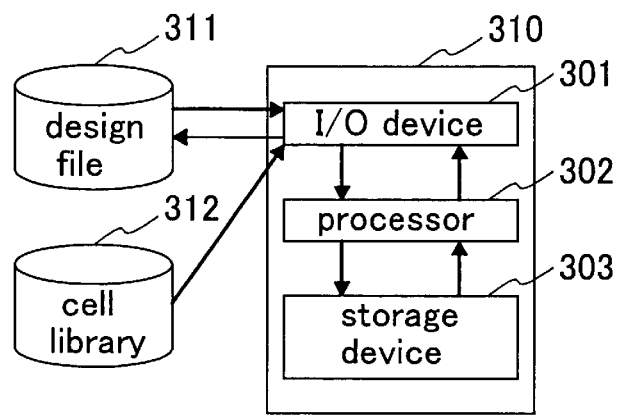
FIG. 11 is an overview of another system in accordance with a preferred embodiment of the present invention.

FIG. 11 is an overview of another system in accordance with the preferred embodiment of the present invention. As similar to above description, the delay calculation method in accordance with the present invention is stored as a program in the memory unit (storage device) 303, for reading the design file 311, the cell library 312 via the input output unit (I/O device) 301, performing the operation by the execution unit (processor) 302, and outputting the result to the design file 311 via the I/O device 301. In this system for example the execution unit (processor) 302 calculates the delay and optimizes in a certain sort on the basis of the result to output the result to the design file 311.

FIG. 7 shows the cell library 312 shown in FIG. 3 and FIG. 11, which illustrates the arrangement of cell library of a preferred embodiment of the present invention.

In the figure, reference numerals 701, 702, 703 designate to library items, each indicating cell type, delay parameters, and transition parameters, respectively.

The parameters a1, b1, c1, d1 used in eq. 4 above used for the cal of cell delay Tc are stored in the item 702 for each cell type. These parameters are predetermined by circuit simulation and the like in advance as have been described above.

The parameters a2, b2, c2, d2 used in eq. 5 and eq. 6 used in the transition time calculation are stored in the item 703 for each cell type. These parameters also are predetermined by circuit simulation and the like.

In accordance with the present construction method, the number of parameters for the cell delay is at most four, and the process steps prior to the calculation such as circuit simulation and the like can be significantly reduced, while at the same time the storage capacitance of the cell library can be reduced, and various processing of the cell library can be performed at high-speed, and furthermore a huge number of cell types can be handled with a limited system resource.

Figure 12A:
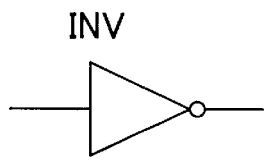
FIG. 12A is an inverter logic cell used in a preferred embodiment of the present invention.
Figure 12B:
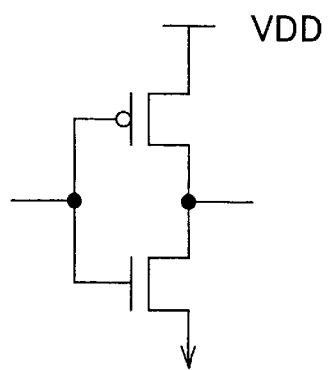
FIG. 12B is the logic circuit diagram of the inverter.
Figure 13A:
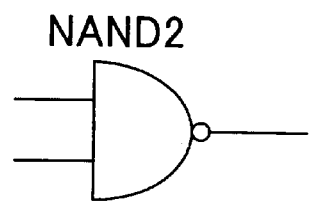
FIG. 13A is an NAND cell used in a preferred embodiment of the present invention.
Figure 13B:
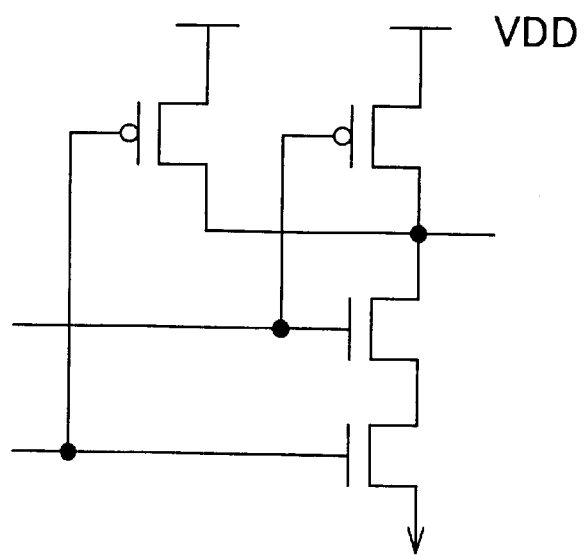
FIG. 13B is a logic circuit diagram of the NAND cell.

FIG. 12A and FIG. 12B show an example of an inverter cell and the circuit diagram thereof, and FIG. 13A and FIG. 13B show an example of a 2-inputs NAND gate cell and the circuit diagram thereof, each composed by insulated gate type field effect semiconductor circuit elements of the complementary connection type used actually in the above preferred embodiments. The LSIs having various cells composed by insulated gate type circuit elements are expected to operate at higher frequency as well as at lower consumption power in the future, in which the present invention effectively contribute to improve the efficient design and production.

Based on the preferred embodiments of the present invention as have been described above, the various tangible methodology thereof are summarized as follows.

(1) A method of delay calculation in an integrated circuit device having a plurality of cells and interconnections connecting therebetween, in which the calculation method of cell delay comprising:

process step (a-1) calculating temporary load delay T1 that is the load delay of the cell from the capacitance Ct that is the sum of all of values of capacitances connected to the output of the cell;

process step (a-2) calculating temporary RC delay T2 that is the delay in the load itself from the resistance and capacitance of the load connected to the output of the cell;

process step (a-3) calculating effective load capacitance Ceff from the temporary load delay Ti and the temporary RC delay T2;

process step (a-4) calculating cell delay Tc based on the effective load capacitance Ceff.

(2) A method of delay calculation in accordance with (1) in which the process step (a-1) is characterized by the process step (a-1-1) calculating the temporary load delay T1 by equation T1=Ron·Ct, from the coefficient of delay variation Ron with respect to the load capacitance of the cell and the total load capacitance Ct.

(3) A method of delay calculation in accordance with (1) in which the process step (a-2) is characterized by process step (a-2-1) substituting the load connected to the output of the cell with an equivalent circuit of RC π type comprising a capacitance C2 connected to the output point of the cell, resistance R, and a capacitance C1 connected to another node of the resistance R, and by process step (a-2-2) calculating the temporary RC delay T2 in accordance with the equation T2=R·C1, from the resistance R and the capacitance C1.

(4) A method of delay calculation in accordance with (1) in which the process step (a-3) is characterized by process step (a-3-1) substituting the load connected to the output of the cell with an equivalent circuit of RC π type comprising a capacitance C2 connected to the output point of the cell, a resistance R, and a capacitance C1 connected to another node of the resistance R, and by process step (a-3-2) calculating the effective load capacitance Ceff on the basis of the capacitance C1 and the capacitance C2, and the temporary load delay T1 and temporary RC delay T2 in accordance with the equation Ceff=C2+C1·T1/(T1+T2)

(5) A method of delay calculation in accordance with (1), in which the process step (a-4) is characterized by process step (a-4-1) calculating delay from the effective load capacitance Ceff, the input transition time TI of the cell, and the delay parameters a1, b1, c1, d1 in accordance with the equation Tc=a1·TI·Ceff+b1·Ceff+c1·TI+d1.

(6) A method of delay calculation in an integrated circuit device having a plurality of cells and interconnections connecting therebetween, in which the calculation method of interconnection delay T comprising:

(b-1) calculating output transition time TT1 of the cell from the capacitance Ct that is the sum of all of value of capacitances connected to the output of the cell;

(b-2) calculating output transition time TT2 of the cell from the effective load capacitance Ceff;

(b-3) calculating temporary interconnection delay Tw0 from the interconnection resistance Rw of the interconnections connected to the cell and the input capacitance Cci of the load cell Celli connected to the interconnection capacitance Cw; and (b-4) calculating interconnection delay Tw from the output transition time TT1 and the output transition time TT2 and the temporary interconnection delay Tw0.

(7) A method of delay calculation in accordance with (6) in which the process step (b-1) and process step (b-2) are characterized by process step (b-1-1) calculating output transition time on the basis of output capacitance C0 that is either the total load capacitance Ct or the effective load capacitance Ceff, and the input transition time TI and transition time parameters a2, b2, c2, d2 in accordance with the equation T=a2·TI·C0+b2·C0+C2·TI+d2.

(8) A method of delay calculation in accordance with (6) in which the process step (b-3) is characterized by process step (b-3-1) calculating partial interconnection delay Tw1 from the interconnection resistance R1 from the starting point of the interconnection delay to be determined to the first branch and the branch capacitance C1 that is total capacitance downward from the branch point 1, in accordance with the equation Tw1=R1·C1; process step (b-3-2) calculating the partial interconnection delay Tw2 on the basis of the interconnection resistance R2 from the branch point 1 to the next branch point 2 and the branch capacitance C2 that is total capacitance downward from the branch point 2, in accordance with the equation Tw2=R2·C2 and then repeating such calculation until the end point; and process step (b-3-3) determines the temporary interconnection delay Tw0 to sum all partial interconnection delays Twi.

(9) A method of delay calculation in accordance with (6) in which the process step (b-3) is characterized by process step (b-3-1-1) calculating temporary partial interconnection delay Twt1 from the interconnection resistance R1 from the starting point of the interconnection delay to be determined to the first branch and temporary branch point capacitance Ct1 that is total capacitance downward from the branch point 1 in accordance with equation Twt1=R1·Ct1; (b-3-1-2) calculating temporary interconnection delay Twt2 on the basis of interconnection resistance R2 from the branch point 1 to the next branch point 2 and temporary branch point capacitance Ct2 that is total capacitance downward from the branch point 2 in accordance with equation Twt2=R2·Ct2, and then repeating this process step until the end point for interconnection delay to be determined; process step (b-3-1-3) calculating reference interconnection delay Tb by adding all of the temporary partial interconnection delays Twti; process step (b-3-2-1) calculating total capacitance Ctti of the load of trunk that correspond to the path for the interconnection delay to calculate at the branch point i; process step (b-3-2-2) substituting the branch load that is not the path for the interconnection delay to be calculated at the branch point i with an equivalent circuit of RC n type having a capacitance Cbi2 connected to the branch point i, a resistance Rbi, and a capacitance Cbi1 connected to another node of the resistance Rbi; process step (b-3-2-3) calculating the temporary branch point RC delay Ti on the basis of the resistance Rbi and the capacitance Cbi1 in accordance with equation Ti=Rbi·Cbi1; process step (b-3-2-4) calculating branch point capacitance ci on the basis of the capacitance Ctti, Cbi1, Cbi2 as well as the reference interconnection delay Tb and the preliminary branch point RC delay Ti in accordance with equation Ci=Ctti+Cbi2+Cbi1·Tb/(Tb+Ti); process step (b-3-3-1) calculating any partial interconnection delays Twi on the basis of the interconnection resistance Ri from the branch point i to the next branch point i+1 and the branch point capacitance Ci in accordance with equation Twi=Ri·Ci; and by process step (b-3-3-2) calculating the temporary interconnection delay Tw0 by summing all of the partial interconnection delay Twi.

(10) A method of delay calculation in accordance with (6) in which the process step (b-4) is characterized by process step (b-4-1) calculating the interconnection delay Tw on the basis of the output transition time TT1 and the output transition time TT2 and the temporary interconnection delay Tw0 in accordance with equation Tw=Tw0+{α·(TT1−TT2)−Tw0}·Tw0/(β·TT2+γ·Tw0), where α, β, and γ are constants.

(11) A method of delay calculation in an integrated circuit having a plurality of cells and interconnections connecting therebetween, in which the calculation method of cell delay comprising:

process step (c-1) calculating temporary delay T0 that is the delay of the cell on the basis of total load capacitance Ct of the capacitance values connected to the output of the cell; process step (c-2) calculating the voltage Vc at the node connected to the load capacitance C connected to the output of the cell at the temporary delay T0; process step (c-3) calculating effective load capacitance Ceff by multiplying the ratio of the voltage Vc to the voltage Vth defining the delay with the capacitance C; process step (c-4) calculating the cell delay Tc on the basis of the effective load capacitance Ceff.

In brief, when applying the present invention to the designing of semiconductor integrated circuit devices, data to be obtained prior to performing the delay calculation can be reduced, and the process steps required when changing cell, or changing device, and changing interconnection parameters may be significantly reduced, allowing the delay calculation to be performed at high-speed and higher precision, resulting in that it can be possible to reduce the design and production period of semiconductor integrated circuit devices.

In addition, in accordance with the present invention, the storage area capacity of the cell library can be reduced while the generation and various processing of the cell library can be performed at high-speed. Also, a huge number of cell types can be handled with a limited system resource.

Although the preferred embodiments of the present invention has been described by way of examples in terms of designing and production of semiconductor integrated circuit devices, it is to be understood that the present invention is not to be limited to the details herein given, but may be modified within the scope of the appended claims, for example the present invention may be applied to the signal delay calculation in case of designing and production of electronics system to be operated at higher frequency by implementing a plurality of electronic circuit elements (such as ICs and IC blocks) on a printed circuit board. By using the method of signal delay calculation in accordance with the present invention, an electronic circuit design may be realized, which may well match the electric characteristics of electronic circuit elements with the electric characteristics of interconnections at higher precision, so that an efficient design and production of electronic circuit system as well as high performance semiconductor integrated circuit device with saving any redundant design margins.

The foregoing description of the preferred embodiments of the invention have been presented for purposes of illustration and description. It is not intended to be exhaustive or to limit the invention to the precise form disclosed, and modifications and variations are possible in light of the above teachings or may be acquired from practice of the invention. The embodiment chosen and described in order to explain the principles of the invention and its practical application to enable one skilled in the art to utilize the invention in various embodiments and with various modifications as are suited to the particular use contemplated. It is intended that the scope of the invention be defined by the claims appended hereto, and their equivalents.

What is claimed is:

1. A calculation method of effective capacitance equivalent to delay with load in interconnections between electronic circuit elements comprising the steps of:

substituting the impedance of an interconnection placed between a first node of an output section of a first electronic circuit element and a second node of an input section of a second electronic circuit element with an equivalent circuit of RCπ type having an equivalent capacitance C1 placed on the side of said second node and an equivalent capacitance C2 placed on the side of said first node and an equivalent resistance R placed between said first node and said second node; and when defining delay from said first electronic circuit element to said first node as t0, calculating the effective capacitance Ceff viewed from said first node in accordance with an equation Ceff=C2+C1·t0/(t0+R·C1).

2. A calculation method according to claim 1, in which: the delay t0 from said first electronic circuit element to said first node is defined by multiplying the sum of said equivalent capacitance C1 and said equivalent capacitance C2 (C1+C2) with a delay variation coefficient Ron predetermined with respect to the load capacitance of said first electronic circuit element.

3. A method of delay calculation in an electronic circuit, comprising the step of:

calculating delay T of said electronic circuit on the basis of the effective capacitance Ceff calculated in accordance with claim 1, using input transition time TI of said first electronic circuit element and delay parameters a1, b1, c1 and d1 in accordance with an equation T=a1·TI·Ceff+b1·Ceff+c1·TI+d1.

4. A method of calculating an effective capacitance equivalent to delay with load in an interconnection between integrated circuit (IC) elements in an integrated circuit (IC) device by substituting the impedance of the interconnection placed between first and second nodes with a RC type equivalent circuit having a capacitor C1, a resistor R and a capacitor C2, wherein the delay is defined from a first IC element to said first node as "t0", and wherein the effective capacitance is calculated as viewed from said first node using C2+C1·"t0"/("t0"+R·C1).

5. A method according to claim 4, wherein the delay "t0" from said first IC element to said first node is defined by multiplying the sum of C1 and C2 (C1+C2) with a delay variation coefficient "Ron" predetermined with respect to the load capacitance of said first IC element.

6. A method according to claim 4, wherein the IC elements correspond to complementary type insulating gate type field effect transistors.

* * * * *